(12) United States Patent
Biswas et al.

(10) Patent No.: US 11,121,687 B1
(45) Date of Patent: Sep. 14, 2021

(54) VOLTAGE GAIN AMPLIFIER ARCHITECTURE FOR AUTOMOTIVE RADAR

(71) Applicant: STMicroelectronics International N.V., Geneva (CH)

(72) Inventors: Riju Biswas, Gautam Buddha Nagar (IN); Ratul Mitra, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/861,602

(22) Filed: Apr. 29, 2020

(51) Int. Cl.
*H03F 3/45* (2006.01)

(52) U.S. Cl.
CPC ..... *H03F 3/45085* (2013.01); *H03F 3/45475* (2013.01); *H03F 2203/45006* (2013.01); *H03F 2203/45026* (2013.01); *H03F 2203/45048* (2013.01); *H03F 2203/45084* (2013.01); *H03F 2203/45088* (2013.01); *H03F 2203/45211* (2013.01)

(58) Field of Classification Search
CPC .................................................. H03F 3/45
See application file for complete search history.

(56) References Cited

U.S. PATENT DOCUMENTS

| | | | |
|---|---|---|---|
| 8,050,642 B2 | 11/2011 | Kim et al. | |
| 8,456,236 B2 | 6/2013 | Moldsvor et al. | |
| 10,312,877 B2 * | 6/2019 | Matsuno | H03G 1/0088 |
| 2006/0061415 A1 * | 3/2006 | Bhattacharjee | H03F 3/45188 327/563 |
| 2006/0284671 A1 * | 12/2006 | Ohba | H03F 3/45753 330/9 |
| 2007/0188229 A1 * | 8/2007 | Abdelli | H03F 3/45183 330/254 |
| 2015/0171811 A1 * | 6/2015 | Wu | H03G 1/0088 330/254 |
| 2017/0272036 A1 * | 9/2017 | Wu | H03F 3/72 |
| 2018/0262374 A1 * | 9/2018 | Cheng | H03F 3/193 |
| 2019/0081604 A1 * | 3/2019 | Thiagarajan | H03G 3/30 |
| 2019/0140609 A1 | 5/2019 | Taghizadeh Ansari et al. | |
| 2019/0363686 A1 | 11/2019 | Grasso | |

FOREIGN PATENT DOCUMENTS

KR    1020150060255 A    6/2015

* cited by examiner

*Primary Examiner* — Patricia T Nguyen
(74) *Attorney, Agent, or Firm* — Crowe & Dunlevy

(57) ABSTRACT

Disclosed herein is a circuit including a differential amplifier having a pair of input transistors coupled in a differential arrangement between adjustable current sources and receiving input differential signals from a pair of input voltage regulators. The adjustable current sources are configured to source more current to the pair of input transistors than current that is sunk from the pair of input transistors. A first amplifier has inputs coupled to receive differential output voltages from the differential amplifier. A second amplifier has inputs coupled to receive amplified differential output voltages from the first amplifier. A low pass filter has inputs coupled to receive further amplified differential output voltages from the second amplifier and produce final differential output voltages.

12 Claims, 2 Drawing Sheets

VOLTAGE GAIN AMPLIFIER ARCHITECTURE FOR AUTOMOTIVE RADAR

TECHNICAL FIELD

This disclosure is related to the field of voltage gain amplifiers for use in the receiver chain of automotive radar devices and, in particular, to a voltage gain amplifier design that increases the operating margin of the transistors of its differential amplifier, maintains linearity regardless of fluctuation of the input common mode voltage, increases the transconductance of the transistors of its differential amplifier in high gain operation, and cancels the DC offset between input differential voltage signals.

BACKGROUND

Radar systems are now regularly used in driver assistance systems in automobiles, such as for determining the distance to other vehicles and objects near the vehicle that is utilizing the radar system. As one example, the cruise control systems of vehicles may utilize radar such that, in the absence of a nearby vehicle in front of the vehicle utilizing the radar system, a set speed is maintained by the vehicle utilizing the radar system, yet when a nearby vehicle is present in front of the vehicle utilizing the radar system, the vehicle utilizing the radar system slows down to maintain a set distance between itself and the nearby vehicle.

Such a radar system includes a transmit chain to transmit radio waves, and a receive chain to receive radio waves that have reflected off a nearby vehicle or object and returned to the vehicle employing the radar system. By analyzing the received radio waves, the distance to the nearby vehicle or object can be determined.

While such radar systems for use in vehicles exist, there is a desire for the development of improved systems having greater linearity, reduced noise, offset cancelation, and with a full output swing matching the full scale range of the ADC used by those systems.

SUMMARY

Disclosed herein is a circuit including: a differential amplifier with a pair of input transistors coupled in a differential arrangement between adjustable current sources and receiving input differential signals from a pair of input voltage regulators, wherein the adjustable current sources are configured to source more current to the pair of input transistors than current that is sunk from the pair of input transistors; a first amplifier having inputs coupled to receive differential output voltages from the differential amplifier; a second amplifier having inputs coupled to receive amplified differential output voltages from the first amplifier; and a low pass filter having inputs coupled to receive further amplified differential output voltages from the second amplifier and produce final differential output voltages.

Feedback circuitry may be configured to adjust the current sourced by the adjustable current sources so as to maintain voltage across the pair of input transistors as constant.

The current sourced and sunk by the adjustable current sources may be configured to be increased in equal magnitude so as to increase transconductance of the differential input pair of transistors without increasing a common mode voltage present at output nodes of the differential amplifier.

Calibration circuitry may be configured to, in a calibration mode, short inputs to the pair of input voltage regulators, compare the final differential output voltages to one another, and adjust the current sourced by the adjustable current sources so that the final differential output voltages are equal to one another.

The differential input pair of transistors may be bipolar junction transistors.

Also disclosed herein is a circuit including a voltage gain amplifier. The voltage gain amplifier may include: a first fixed current source configured to source a first current, and a second fixed current source configured to source a second current, wherein the first and second currents are equal in magnitude; a third fixed current source configured to sink a third current, and a fourth fixed current source configured to sink a fourth current, wherein the third and fourth currents are equal in magnitude to one another and lesser in magnitude than the first and second currents; a first bipolar junction transistor having a collector coupled to the first fixed current source, an emitter coupled to the third fixed current source, and a base coupled to receive a first regulated differential input voltage; a first input amplifier having a first input receiving a first differential input signal, a second input coupled to the emitter of the first bipolar junction transistor, and an output generating the first regulated differential input voltage; a second bipolar junction transistor having a collector coupled to the second fixed current source, an emitter coupled to the fourth fixed current source, and a base coupled to receive a second regulated differential input voltage; and a second input amplifier having a first input receiving a second differential input signal, a second input coupled to the emitter of the second bipolar junction transistor, and an output generating the second regulated differential input voltage.

The voltage gain amplifier may also include an output amplifier having inputs coupled to the collectors of the first and second bipolar junction transistors to receive differential output voltages therefrom, and outputs generating amplified differential output voltages therefrom.

The voltage gain amplifier may also include a resistance coupled between the emitters of the first and second bipolar junction transistors.

The voltage gain amplifier may also include: a first adjustable current source coupled in parallel with the first fixed current source, the first adjustable current source configured to source a first variable current in response to a control signal; a second adjustable current source coupled in parallel with the second fixed current source, the second adjustable current source configured to source a second variable current in response to the control signal, wherein the second variable current is equal in magnitude to the first variable current; and an amplifier having a first input coupled to a center tap of the resistance and a second input coupled to a reference voltage, wherein the amplifier is configured to generate the control signal so as to adjust the first and second adjustable current sources such that the first and second variable currents modulate resulting in collector-emitter voltages of the first and second bipolar junction transistors staying constant as an input common mode voltage produced at the center tap of the resistance varies.

The voltage gain amplifier may also include: a third adjustable current source coupled in parallel with the first fixed current source and the first adjustable current source; a fourth adjustable current source coupled in parallel with the second fixed current source and the second adjustable current source; a fifth adjustable current source coupled in parallel with the third fixed current source; and a sixth adjustable current source coupled in parallel with the fourth fixed current source; wherein the third adjustable current source sources a third variable current and the fourth adjustable current source sources a fourth variable current, the third and fourth variable currents being equal in magnitude; and wherein the fifth adjustable current source sinks a fifth variable current and the sixth adjustable current source sinks a sixth variable current, the fifth and sixth variable currents being equal in magnitude to one another and being equal in magnitude to the third and fourth variable currents.

An additional voltage gain amplifier may have inputs receiving the amplified differential output voltages and outputs generating further amplified differential output voltages, and a low pass filter configured to filter the further amplified differential output voltages to produce final differential output voltages.

Calibration circuitry may be configured to, in a calibration mode, short the first inputs of the first and second input amplifiers to one another, compare the final differential output voltages to one another, and adjust the current sourced by the third and fourth adjustable current sources so that the final differential output voltages are equal to one another.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
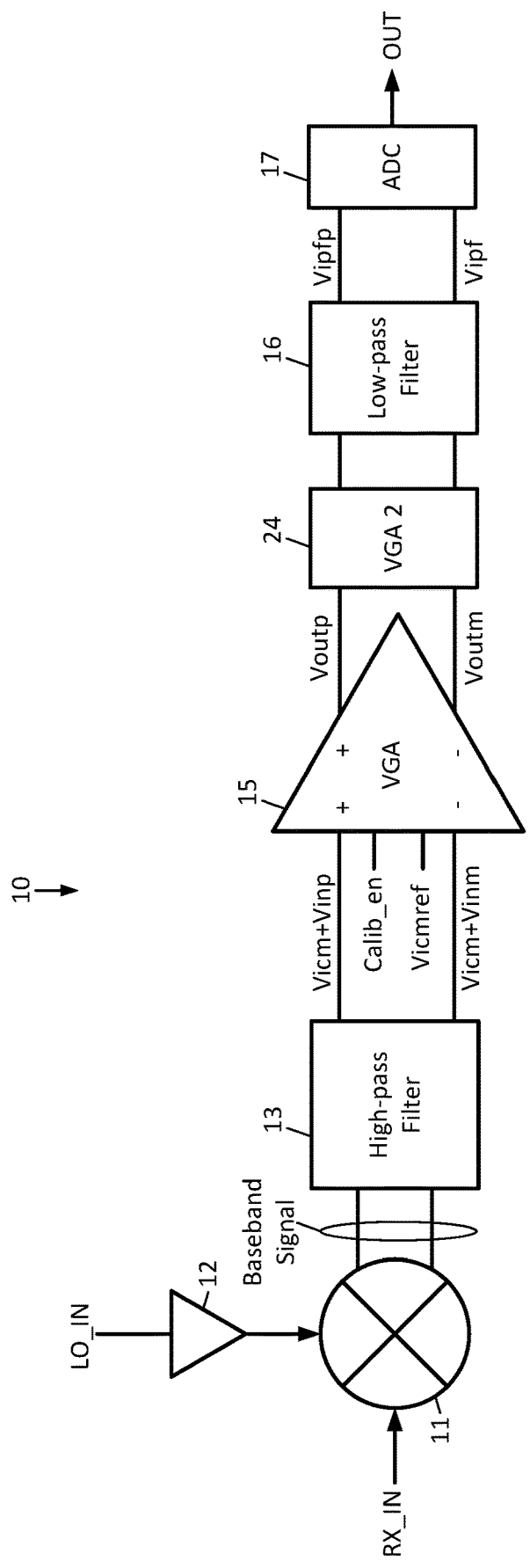
FIG. 1 is a block diagram of a receive chain of a vehicular radar system including a voltage gain amplifier design to be described herein.

With reference to FIG. 1, a receive chain 10 for a vehicular radar system is now described. The receive chain 10 includes a mixer 11, which receives an input radiofrequency signal RX_IN from a radar wave receiver. This input radiofrequency signal RX_IN represents radar waves that have reflected off a target and returned to the receive chain 10.

A local oscillator output LO_IN is amplified by an amplifier 12, and the mixer 11 mixes the amplified local oscillator output LO_IN with the input radiofrequency signal RX_IN to produce a baseband signal. A high pass filter 13 filters the baseband signal to attenuate the DC spur and outputs the baseband signal in differential form. The outputs of the high pass filter 13 are the differential signals Vinp and Vinm, and each output also carries the input common mode voltage Vicm.

A voltage gain amplifier (VGA) 15 disclosed herein receives the differential input signal Vinp+Vicm at its non-inverting input terminal, receives the differential input signal Vinm+Vicm at its inverting input terminal, receives a calibration enable signal Calib_en, and receives an input common mode reference signal Vicmref. The VGA 15 generates the output differential signals Voutp and Voutm, which are received as input by a second voltage gain amplifier (VGA 2) 24 that provides further amplification.

Note that the second VGA 24 may be of any design, and in some instances does not have the same structure and function as the VGA 15. Output of the second VGA 24 is received and filtered by the low-pass filter 16 to produce the output differential signals Vlpfp and Vlpfm, which are then converted to the digital domain by the analog to digital converter (ADC) 17. The digital signal output OUT from the ADC 17 can be used to determine the distance between the vehicle into which the receive chain 10 is integrated and nearby vehicles or objects.

Figure 2:
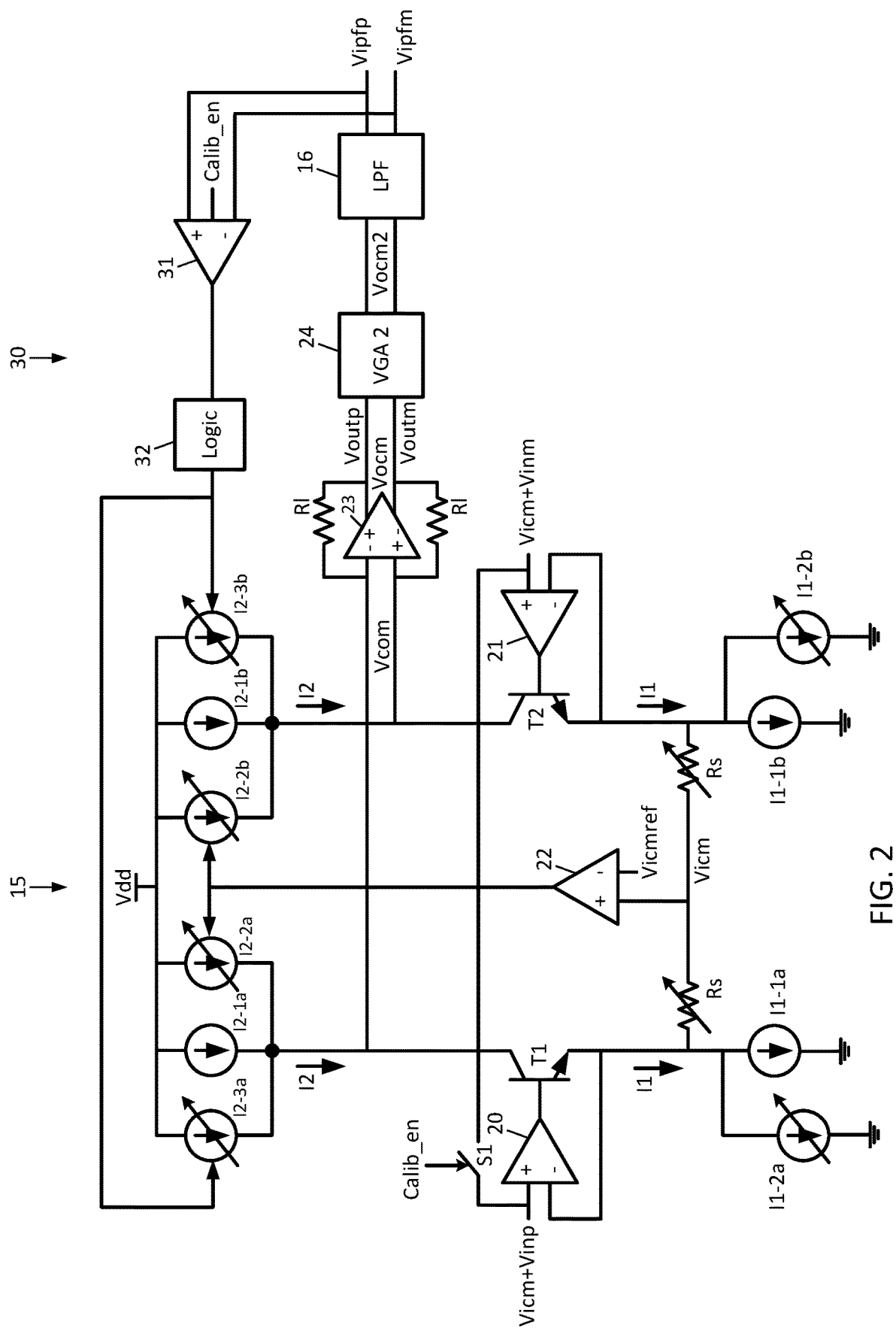
FIG. 2 is a schematic diagram of the voltage gain amplifier of FIG. 1.

The structure and operation of the VGA 15 is now described with reference to FIG. 2. In particular, the structure is first described, and thereafter, the operation will be described.

The VGA 15 is comprised of a differential pair of NPN bipolar junction transistors T1 and T2. A first amplifier 20 configured as a buffer receives the differential input signal Vinp+Vicm at its non-inverting input, has its inverting input coupled to the emitter of the transistor T1, and provides its output to the base of the transistor T1. Similarly, a second amplifier 21 configured as a buffer receives the differential input signal Vinm+Vicm at its non-inverting input, has its inverting input coupled to the emitter of the transistor T2, and provides its output to the base of the transistor T2. A switch Si is closed to selectively connect the non-inverting terminals of the amplifiers 20 and 21 when the calibration enable signal Calib_en is high, and is otherwise open.

The emitters of the transistors T1 and T2 are coupled to one another through the series connected adjustable resistors Rs. A fixed tail current source I1-1a and an adjustable tail current source I1-2a are coupled in parallel and configured to sink current I1 from the emitter of the transistor T1. Similarly, a fixed tail current source I1-1b and an adjustable tail current source I1-2b are coupled in parallel and configured to sink current I1 from the emitter of the transistor T2.

A fixed current source I2-1a and adjustable current sources I2-2a and I2-3a are coupled in parallel and configured to source current I2 to the collector of the transistor T1. Similarly, a fixed current source I2-1b and adjustable current sources I2-2b and I2-3b are coupled in parallel and configured to source current I2 to the collector of the transistor T2.

An amplifier 22 has its non-inverting terminal connected to the center tap between resistors Rs, its inverting terminal receiving the input common mode reference signal Vicmref, and provides its output as an adjustment signal for the current sources I2-2a and I2-2b.

An amplifier 23 has its non-inverting terminal coupled to the collector of the transistor T2, and its inverting terminal coupled to the collector of the transistor T1. A positive feedback resistor Rl is coupled between the inverting terminal and non-inverting output of the amplifier 23, and a negative feedback resistor Rl is coupled between the non-inverting terminal and the inverting output of the amplifier 23. The amplifier 23 produces differential output signals Voutp and Voutm, which are amplified by the second voltage gain amplifier 24 and then filtered by the low pass filter 16 to produce differential output signals Vlpfp and Vlpfm.

A comparator 31 has its inverting terminal coupled to receive the differential output signal Vlpfm and its non-inverting terminal coupled to receive the differential output signal Vlpfp (see, FIG. 1), and is enabled by the calibration enable signal Calib_en. The output of the comparator 31 is passed to the logic circuit 32, which generates a compensation voltage for adjusting the current sources I2-3a and I2-3b. Note that, as in FIG. 1, the output signals Vlpfp and Vlpfm of the low pass filter 16 are digitized by the ADC 17 to produce the output signal OUT.

Operation of the circuit shown in FIG. 2 will now be described. Notice that the transistors T1 and T2 are bipolar junction transistors, which have a higher transconductance as compared to field effect transistors. However, bipolar junction transistors have the drawback of base current leakage at fast corners. To avoid degradation in performance due to this base leakage, the amplifiers 20 and 21 act as voltage regulators, maintaining the bias voltages on the bases of the transistors T1 and T2 respectively at Vinp+Vicm and Vinm+Vicm, and increasing the transconductance of the transistors T1 and T2.

Since the transistors T1 and T2 are configured as a differential amplifier, the difference between the differential input voltages Vinp+Vicm and Vinm+Vicm is amplified and passed as input to the amplifier 23, which provides further amplification and produces the output differential signals Voutp and Voutm. The second VGA 24 further amplifies the output differential signals Voutp and Voutm, and after low pass filtering by the low pass filter 16, the output differential signals Vlpfp and Vlpfm are produced.

Note that the currents I2-1$a$ and I2-1$b$ are constant and equal in magnitude to one another. Note also that the currents I1-1$a$ and I1-1$b$ are constant and equal in magnitude to one another. The magnitude of the current I2 is larger than the magnitude of the current I1, with the result being that the extra current flows through the feedback resistors Rl, thereby shifting the common mode voltage Vcom of the output nodes of the differential amplifier at the collectors of the transistors T1 and T2 upward by Rl*(I2−I1). This increase in the common mode voltage Vcom increases the operating margin (Vce margin) of the transistors T1 and T2, increases the transconductance of the transistors T1 and T2, and improves the linearity of the transistors T1 and T2.

Since the voltage Vinp will appear at the emitter of the transistor T1 and the voltage Vinm will appear at the emitter of the transistor T2, a small signal current will flow through the adjustable resistances Rs, yielding a gain of Rl/Rs for the VGA 15.

The feedback loop formed by the connections of the amplifier 22 serves to modulate the currents sourced by current sources I2-2$a$ and I2-2$b$ (and therefore serves to modulate I2) so as to keep the collector to emitter voltages Vce of the transistors T1 and T2 constant as the input common mode voltage Vicm changes with respect to the reference input common mode voltage Vicmref. This improves linearity of the transistors T1 and T2 across the input signal range.

When the gain Rl/Rs of the VGA 15 is to be increased by reducing Rs (for example, increasing the gain to over 40 dB), it is desired for the transconductance seen from the emitter sides of the transistors T1 and T2 to be much greater than 1/Rs. Since Rs is lowered to increase the gain of the VGA, the magnitude of the currents sunk by the adjustable current sources I1-2$a$ and I1-2$b$ are increased (and therefore the magnitude of the current I1 is increased) so as to increase the transconductance of the transistors T1 and T2. Together with this, the magnitude of the currents sourced by the current sources I2-3$a$ and I2-3$b$ is increased equally with the increase in the magnitude of the currents sourced by the adjustable current sources I1-2$a$ and I1-2$b$ (and therefore the magnitude of the current I2 is increased equally with the increase of the magnitude of the current I1) so as to not alter the common mode voltage Vcom.

A calibration is performed to cancel DC offset present in the input signals Vinp and Vinm. In calibration mode, the calibration enable signal Calib_en is set to a logic high, closing the switch Si and shorting the non-inverting inputs of the amplifiers 20 and 21. Due this shorting, the differential output voltage represented by Vlpfp and Vlpfm should be zero in the absence of a DC offset. Therefore, in the calibration mode, the comparator 31 is enabled by the calibration enable signal Calib_en. If the differential output voltages Vlpfp and Vlpfm are not equal, the output of the comparator 31 will switch to a logic high or logic low, which will be read by the logic circuit 32. The logic circuit 32 will then modify the magnitude of the current output by the adjustable current source I2-3$b$ with respect to the magnitude of the current output by the adjustable current source I2-3$a$, or vice versa, until the comparator 31 detects that the differential output voltages Vlpfp and Vlpfm are equal. At this point, the logic block 32 would maintain the magnitudes of the currents output by the adjustable current sources I2-3$b$ and I2-3$a$ at their current levels, since at this point, the DC offset in the differential output voltages Vlpfp and Vlpfm has been canceled.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   a differential amplifier comprising a pair of input transistors coupled in a differential arrangement between adjustable current sources and receiving input differential signals from a pair of input voltage regulators, wherein the adjustable current sources are configured to source more current to the pair of input transistors than current that is sunk from the pair of input transistors;
   a first amplifier having inputs coupled to receive differential output voltages from the differential amplifier;
   a second amplifier having inputs coupled to receive amplified differential output voltages from the first amplifier; and
   a low pass filter having inputs coupled to receive further amplified differential output voltages from the second amplifier and produce final differential output voltages.

2. The circuit of claim 1, further comprising feedback circuitry that is configured to adjust the current sourced by the adjustable current sources so as to maintain voltage across the pair of input transistors as constant.

3. The circuit of claim 2, wherein the current sourced and sunk by the adjustable current sources is configured to be increased in equal magnitude so as to increase transconductance of the pair of input transistors without increasing a common mode voltage present at output nodes of the differential amplifier.

4. The circuit of claim 3, further comprising calibration circuitry configured to, in a calibration mode, short inputs to the pair of input voltage regulators, compare the final differential output voltages to one another, and adjust the current sourced by the adjustable current sources so that the final differential output voltages are equal to one another.

5. The circuit of claim 1, wherein the pair of transistors are bipolar junction transistors.

6. A circuit, comprising:
   a voltage gain amplifier comprising:
      a first fixed current source configured to source a first current, and a second fixed current source configured to source a second current, wherein the first and second currents are equal in magnitude;

a third fixed current source configured to sink a third current, and a fourth fixed current source configured to sink a fourth current, wherein the third and fourth currents are equal in magnitude to one another and lesser in magnitude than the first and second currents;

a first bipolar junction transistor having a collector coupled to the first fixed current source, an emitter coupled to the third fixed current source, and a base coupled to receive a first regulated differential input voltage;

a first input amplifier having a first input receiving a first differential input signal, a second input coupled to the emitter of the first bipolar junction transistor, and an output generating the first regulated differential input voltage;

a second bipolar junction transistor having a collector coupled to the second fixed current source, an emitter coupled to the fourth fixed current source, and a base coupled to receive a second regulated differential input voltage; and a second input amplifier having a first input receiving a second differential input signal, a second input coupled to the emitter of the second bipolar junction transistor, and an output generating the second regulated differential input voltage.

7. The circuit of claim 6, wherein the voltage gain amplifier further comprises an output amplifier having inputs coupled to the collectors of the first and second bipolar junction transistors to receive differential output voltages therefrom, and outputs generating amplified differential output voltages therefrom.

8. The circuit of claim 7, wherein the voltage gain amplifier further comprises a resistance coupled between the emitters of the first and second bipolar junction transistors.

9. The circuit of claim 8, wherein the voltage gain amplifier further comprises:

a first adjustable current source coupled in parallel with the first fixed current source, the first adjustable current source configured to source a first variable current in response to a control signal;

a second adjustable current source coupled in parallel with the second fixed current source, the second adjustable current source configured to source a second variable current in response to the control signal, wherein the second variable current is equal in magnitude to the first variable current; and an amplifier having a first input coupled to a center tap of the resistance and a second input coupled to a reference voltage, wherein the amplifier is configured to generate the control signal so as to adjust the first and second adjustable current sources such that the first and second variable currents modulate resulting in collector-emitter voltages of the first and second bipolar junction transistors staying constant as an input common mode voltage produced at the center tap of the resistance varies.

10. The circuit of claim 9, wherein the voltage gain amplifier further comprises:

a third adjustable current source coupled in parallel with the first fixed current source and the first adjustable current source;

a fourth adjustable current source coupled in parallel with the second fixed current source and the second adjustable current source;

a fifth adjustable current source coupled in parallel with the third fixed current source; and a sixth adjustable current source coupled in parallel with the fourth fixed current source;

wherein the third adjustable current source sources a third variable current and the fourth adjustable current source sources a fourth variable current, the third and fourth variable currents being equal in magnitude; and wherein the fifth adjustable current source sinks a fifth variable current and the sixth adjustable current source sinks a sixth variable current, the fifth and sixth variable currents being equal in magnitude to one another and being equal in magnitude to the third and fourth variable currents.

11. The circuit of claim 10, further comprising an additional voltage gain amplifier having inputs receiving the amplified differential output voltages and outputs generating further amplified differential output voltages, and a low pass filter configured to filter the further amplified differential output voltages to produce final differential output voltages.

12. The circuit of claim 11, further comprising calibration circuitry configured to, in a calibration mode, short the first inputs of the first and second input amplifiers to one another, compare the final differential output voltages to one another, and adjust the current sourced by the third and fourth adjustable current sources so that the final differential output voltages are equal to one another.

* * * * *